(12) United States Patent
Kamatsuki

(10) Patent No.: US 6,391,677 B1
(45) Date of Patent: May 21, 2002

(54) APERTURE FOR AN EXPOSURE APPARATUS FOR FORMING A FINE PATTERN ON A SEMICONDUCTOR WAFER

(75) Inventor: Issei Kamatsuki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/527,391

(22) Filed: Mar. 16, 2000

(30) Foreign Application Priority Data

Mar. 26, 1999 (JP) ............................................. 11-084043
Aug. 23, 1999 (JP) ............................................. 11-235195

(51) Int. Cl.⁷ .............................................. H01L 21/00
(52) U.S. Cl. .............................. 438/69; 355/53; 355/71; 430/4; 430/5; 359/63; 359/66
(58) Field of Search .................... 438/69; 355/53–71; 430/4–5; 359/562–566

(56) References Cited

U.S. PATENT DOCUMENTS

| | | | | |
|---|---|---|---|---|
| 5,329,333 A | * | 7/1994 | Noguchi et al. ............... | 355/53 |
| 5,610,684 A | * | 3/1997 | Shiraishi ....................... | 355/55 |
| 5,659,429 A | * | 8/1997 | Kudo ........................... | 359/727 |
| 5,677,757 A | * | 10/1997 | Taniguchi et al. ............. | 355/71 |
| 5,978,138 A | * | 11/1999 | Kang et al. ................... | 359/562 |

FOREIGN PATENT DOCUMENTS

| JP | 2-166717 | * | 6/1990 | .................... 21/30 |
|---|---|---|---|---|
| JP | 5-175100 | * | 7/1993 | .................... 21/30 |

* cited by examiner

Primary Examiner—Matthew Smith
Assistant Examiner—Granvill D Lee, Jr.
(74) Attorney, Agent, or Firm—Volentine Francos, PLLC

(57) ABSTRACT

An aperture body has a light transmissive region defined therein which includes first, second, third and fourth curved segments. During an exposure process, each curved segment of the light transmissive region contributes to an improved resolution and optimum depth of focus (DOF).

36 Claims, 11 Drawing Sheets

APERTURE FOR AN EXPOSURE APPARATUS FOR FORMING A FINE PATTERN ON A SEMICONDUCTOR WAFER

FIELD OF THE INVENTION

The present invention relates to an aperture for a projection exposure apparatus which is used to form fine patterns on a semiconductor wafer and to a method for forming a fine pattern on a semiconductor wafer.

BACKGROUND OF THE INVENTION

In the field of an exposure processes, various technological improvements have been proposed from the view point of achieving a good resolution and a optimum depth of focus (DOF).

To obtain a good resolution and optimum DOF, various aperture configurations are disclosed in Japanese Laid Open Patent Publication: HEI5-275315, published on Oct. 22, 1993, and HEI7-29788, published on Jan. 31, 1995.

The aperture configuration is important in obtaining good resolution and the DOF characteristics. This is because an angle of light which is applied to a mask carrying a circuit pattern depends on the configuration of the aperture.

SUMMARY OF THE INVENTION

The first object of the invention is to provide an aperture which is used in an exposure process of a semiconductor manufacturing process, and which makes it possible to achieve a good resolution and an optimum depth of focus.

The second object of the invention is to provide a method for forming a fine pattern on a semiconductor wafer with using an improved aperture.

To achieve the first object, in a typical embodiment of the present invention, an aperture is comprised of a light transmissive region which is defined by first, second, third and fourth curves.

To achieve the second object, in an exposure process of a semiconductor manufacturing process, the exposure is carried using an aperture that has a light transmissive region which is defined by first, second, third and fourth curves, being interposed between a light source and a semiconductor wafer.

According to this invention, during the exposure process, each curve of the light transmissive regions contributes to an improvement in the resolution and optimum depth of focus (DOF).

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood.

Figure 1:
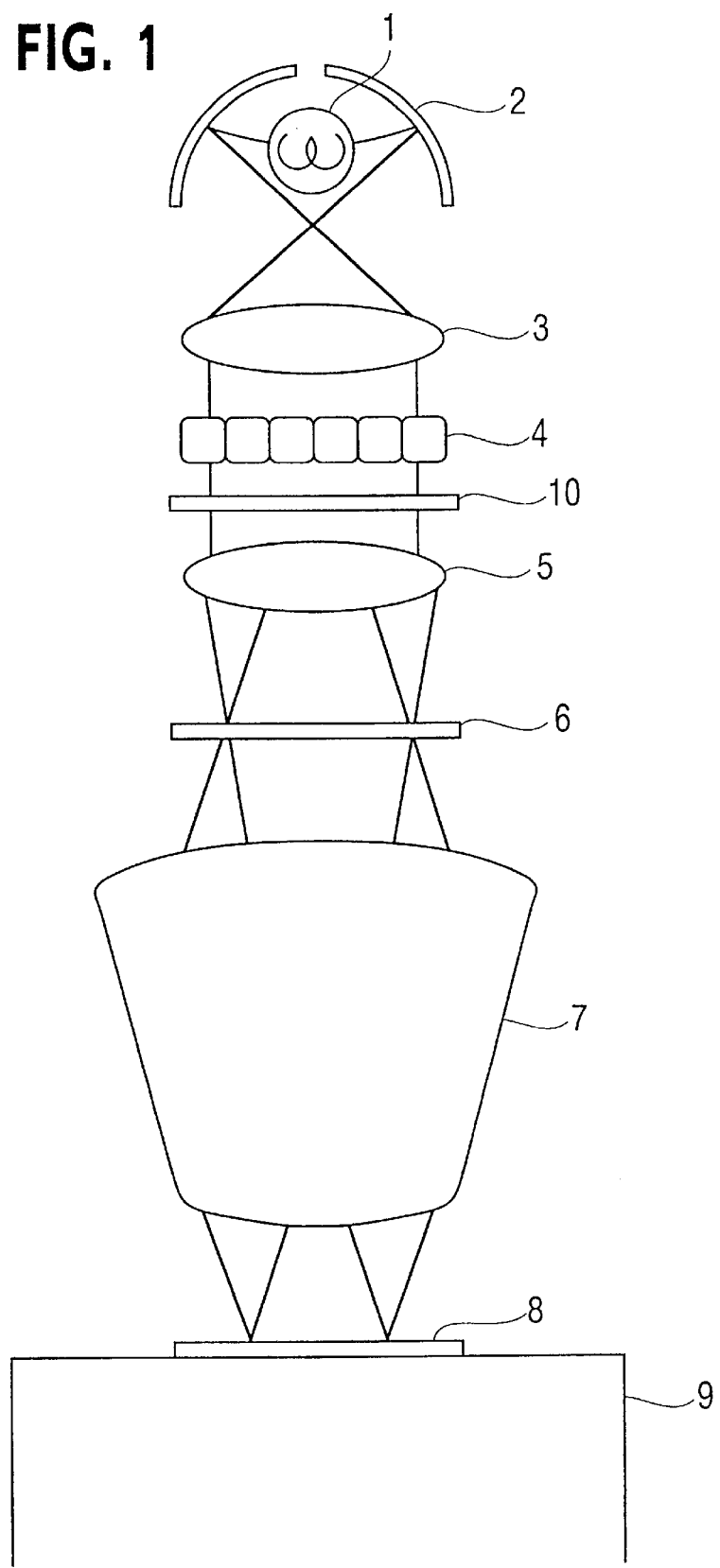
FIG. 1 is an illustration of a projection exposure apparatus according to the first preferred embodiment.

FIG. 1 illustrates an outline of a projection exposure apparatus according to the present invention. The projection apparatus includes a light source 1, an elliptic mirror 2, a collector lens 3, a fly-eye lens 4, a condenser lens 5, a reticle 6, a projection lens 7, a semiconductor wafer 8, a wafer table 9 and an aperture 10. The aperture 10 is interposed between the fly-eye lens 4 and the condenser lens 5.

A description will be given of the operation of the projection exposure apparatus. A light emitted from the light source 11 is reflected by the elliptic mirror 2 and is condensed to the collector lens 3. The light is caused to be parallel with an optical axis by the collector lens 3 and is impinged onto the fly-eye lens 14. The light transmitted through the fly-eye lens 14 is transmitted through the aperture 10 and is condensed by the condenser lens 5. The light transmitted through the condenser lens 5 is applied to the reticle 6 on which is formed a predetermined circuit pattern. The light then passes through the reticle 6 to be focused on the semiconductor wafer 8 past the projection lens 7, whereby the circuit pattern is printed on the surface of the semiconductor wafer 8 which is set on the wafer table 9.

Figure 2:
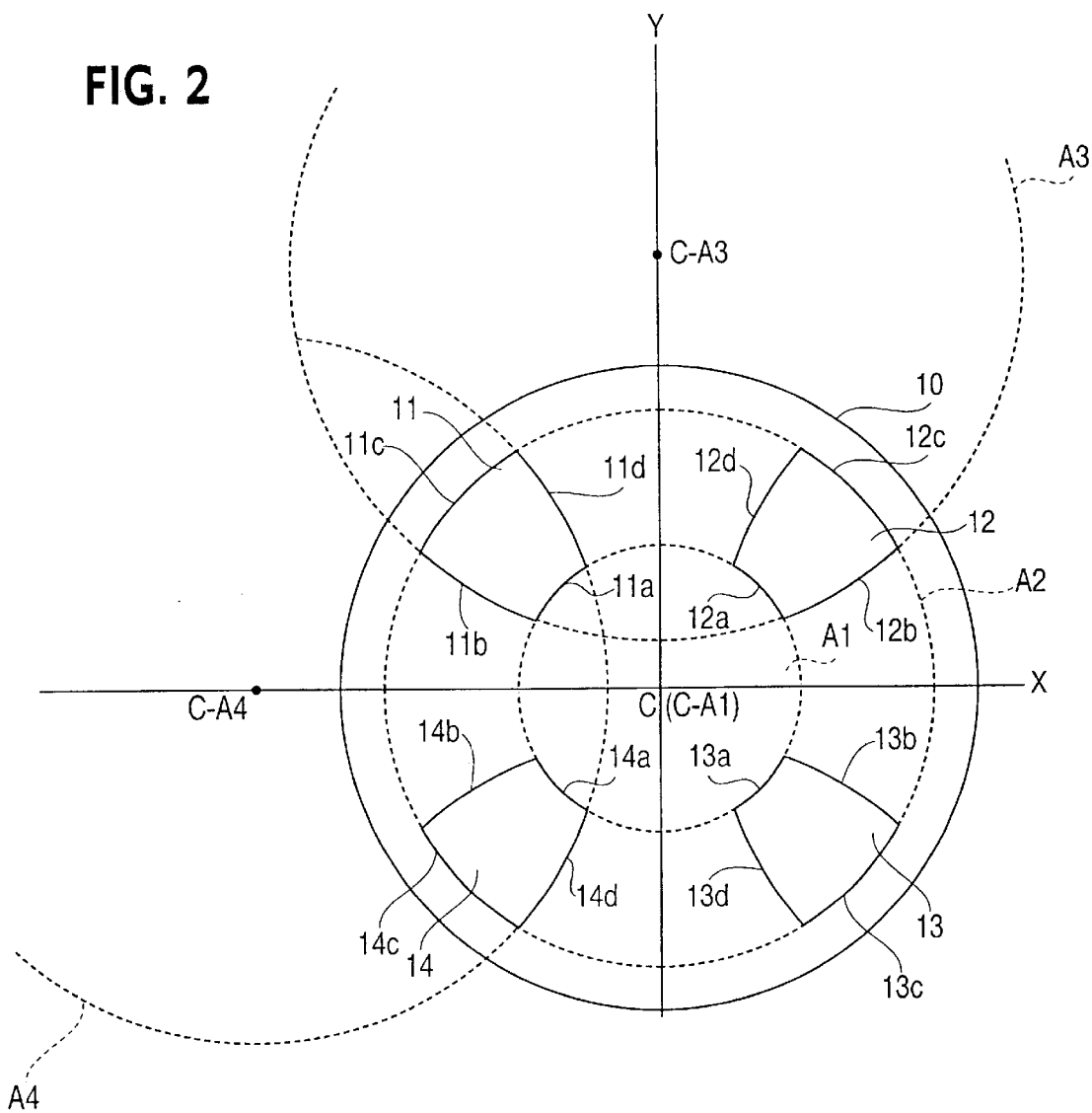
FIG. 2 is a plane view of an aperture according to the first preferred embodiment.

A plane view of an aperture 10 according to a first preferred embodiment is shown in FIG. 2. The aperture 10 includes a plurality of light transmissive regions 11, 12, 13, 14. A region outside the light transmissive regions interrupts or blocks the light. An X-axis and a Y-axis pass through the center C of the aperture 10 at right angles.

A light transmissive region 11 is defined by a first curve 11a, a second curve 11b, a third curve 11c and a fourth curve 11d. In this embodiment, these curves are arcs. The first curve 11a is opposite to the third curve 11c and the second curve 11b is opposite to the fourth curve 11d. The first curve 11a is salient toward to the third curve 11c, and the third curve 11c is salient away from the first curve 11a, the second curve 11b is salient away from the fourth curve 11d, and the fourth curve 11d is salient away from the second curve 11b. As shown in FIG. 2, the configurations of the light transmissive regions 12, 13, 14 are similar to that of the light transmissive region 11.

The first curves 11a, 12a, 13a, 14a are located on the circumference of an imaginary a circle A1. The center of the circle A1 corresponds to the center C of the aperture 10. The third curves 11c, 12c, 13c, 14c are located on the circumference of an imaginary circle A2. The circle A1 and the circle A2 are concentric circles. A diameter of the circle A1 is half a diameter of the circle A2.

The second curve 11b is located on the circumference of an imaginary circle A3. The center C-A3 of the circle A3 is on the Y-axis at a distance of 1.3 times a radius of the circle A2 from the center C. A radius of the circle A3 is 1.1 times the radius of the circle A2. The fourth curve 11d is located on the circumference of an imaginary circle A4. The center C-A4 of the circle A4 is on the X-axis at a distance of 1.3 times a radius of the circle A2 from the center C. A radius of the circle A4 is 1.1 times the radius of the circle A2. The light transmissive regions 12, 13, 14 are similar configured.

The light transmissive regions 11 and 12 are symmetrical about the Y-axis, and the light transmissive regions 12 and 13 are symmetrical about the X-axis. Also, the light transmissive regions 13 and 14 are symmetrical about the Y-axis, and the light transmissive regions 14 and 11 are symmetrical about the X-axis. Also, these light transmissive regions 11, 12, 13, 14 are symmetrically disposed with respect to the center C.

In the exposure process, in the case where an X-axis and a Y-axis of the reticle 6 is set to the X and Y axes of the aperture 10, the second curve 11b contributes to an improved resolution and optimum depth of focus (DOF) with respect to patterns which are formed in the direction of the X-axis on the reticle 6. Also, the fourth curve 11d contributes to an improved resolution and DOF with respect to patterns which are formed in the direction of the Y-axis on the reticle 6. The first and third curve 11a and 11d contribute to an improved resolution and DOF with respect to patterns which are formed in all directions on the reticle 6. In particular, the first curve 11a contributes to a significant improvement with respect to inclined patterns between the X-axis and the Y-axis, compared with the second curve 11b and fourth curve 11d. The second, third and fourth light transmissive regions 12, 13, 14 provide similar improvements.

With respect to the patterns which are formed in the direction of the X-axis on the reticle 6, it is possible to further enhance the resolution by reducing radius of the circle A3 while maintaining the location of the center C-A3, and/or by increasing a distance between the center C of the aperture 10 and the center of the circle A3.

With respect to the patterns which are formed in the direction of the Y-axis on the reticle 6, it is possible to further enhance the resolution by reducing the radius of the circle A4 while maintaining the location of the center C-A4, and/or by increasing a distance between the center C of the aperture 10 and the center of the circle A4.

With respect to the inclined patterns between the X-axis and the Y-axis, it is possible to further enhance the resolution by increasing the radius of the circle A1 while maintaining the location of the center C-A1.

If the center C-A1 of the circle A1 is moved in the direction of the X-axis (or Y-axis), it is possible to obtain a biased resolution toward to the X-axis (or Y-axis).

That is, if each curve is adjusted such that of the light transmissive region 11 is reduced in size, it is possible to further improve resolution and a optimum depth of focus (DOF). On the contrary, if the light transmissive regions are made larger, a throughput is improved since the amount of light which is transmitted through the aperture is increased. Also, the second, third and fourth light transmissive regions 12, 13, 14 function in a likewise manner.

Therefore, as each light transmissive region is formed by four curves, it is possible to adjust the characteristic of resolution individually, according to the patterns which are formed in the direction of the X or Y-axis and the inclined patterns between the X-axis and the Y-axis on the reticle 6.

In FIG. 2, as the angles between adjacent curves are comparatively large, a uniformity of the distribution of light strength is improved in the exposure process.

Above the semiconductor wafer 8, as a result of an offset between the light transmitted through the light transmissive region 11 and the light transmitted through the light transmissive region 13, an offset between the light transmitted through the light transmissive region 12 and the light transmitted through the light transmissive region 14, and an offset between 0-order light and −1-order light, a good resolution can be obtained even if the circuit patterns formed on the reticle 6 are very fine.

In the aperture 10 shown in FIG. 2, since light interrupting regions located between the light transmissive regions extend from the center C of the aperture, a radial width of the light interrupting regions is relatively wide. And, at the center of the aperture 10, since a light interrupting region is configured as the circle A1, a mechanical strength of the aperture 10 is improved.

Figure 3:
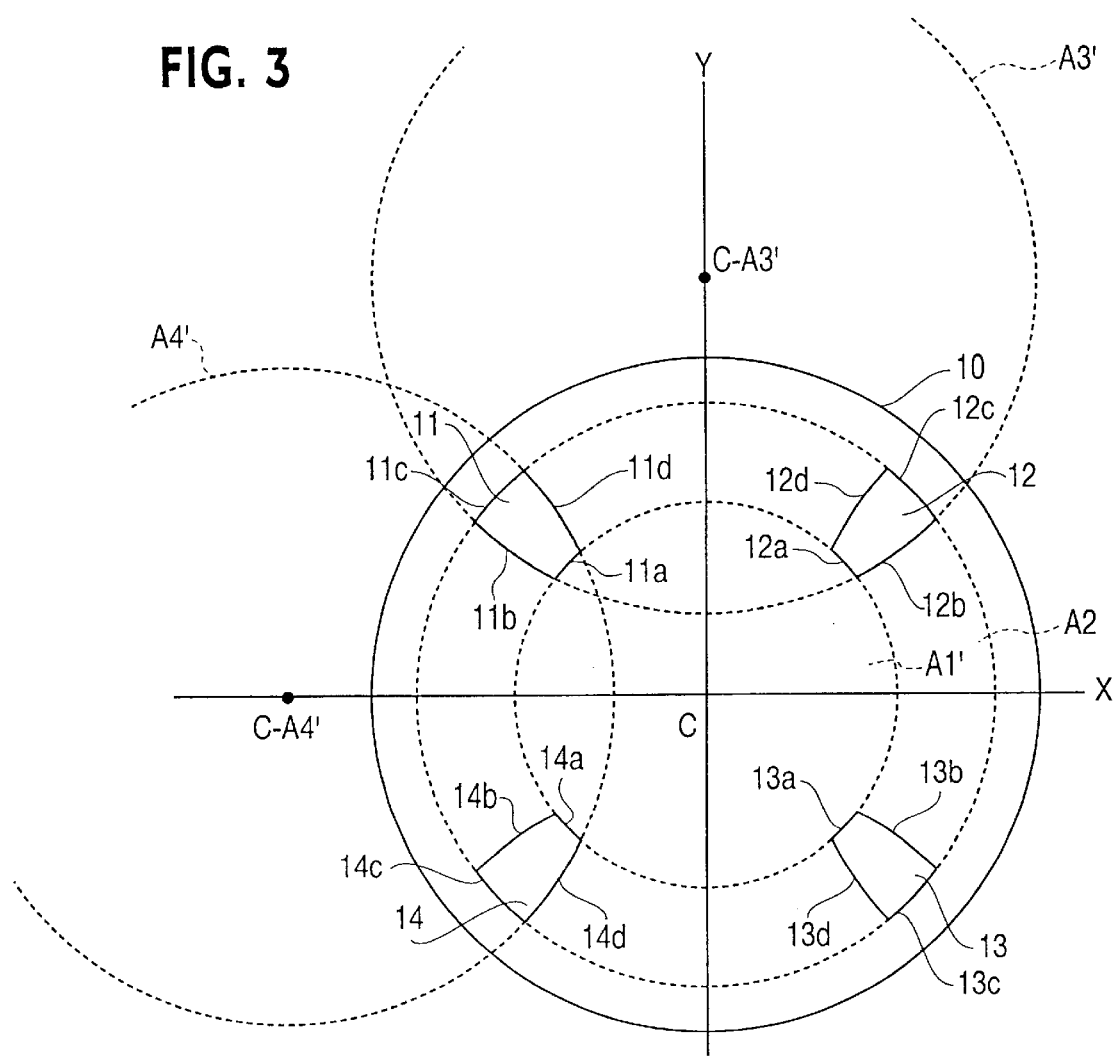
FIG. 3 is a plane view of a variation according to the first preferred embodiment.

An aperture 10' has smaller light transmissive regions than does the aperture 10 in the first preferred embodiment is shown in FIG. 3.

In FIG. 3, first curves 11a, 12a, 13a, 14a of each light transmissive region are located on the circumference of an imaginary circle A1'. The diameter of the circle A1' is seven tenths the diameter of the circle A2.

The second curve 11b is located on the circumference of an imaginary circle A3'. The center C-A3' of the circle A3' is on the Y-axis at a distance of 1.3 times a radius of the circle A2 from the center C. A radius of the circle A3' is the substantially same as the radius of the circle A2. The fourth curve 11d is located on the circumference of an imaginary circle A4'. The center C-A4' of the circle A4' is on the X-axis at a distance of 1.3 times a radius of the circle A2 from the center C. A radius of the circle A4' is substantially the same as the radius of the circle A2. The light transmissive regions 12, 13, 14 are similarly configured.

As shown in FIG. 3, if each curve is adjusted such that of the light transmissive regions is reduced in size, it is possible to further improve resolution and optimum depth of focus. Further, a mechanical strength of the aperture is increased. The diaphragm of each light transmissive region can be selected by a designer in consideration of the width of a fine pattern and a throughput in the exposure process.

Further, a variational aperture in which the first curves and the third curves are not defined by concentric circles, and another variational aperture in which each curve is salient in opposited directions to that shown in FIG. 2, are possible. Further, this preferred embodiment, the curves are defined by the arcs of a circle. However, the curves can be defined by other shapes, such as ellipses.

Figure 4:
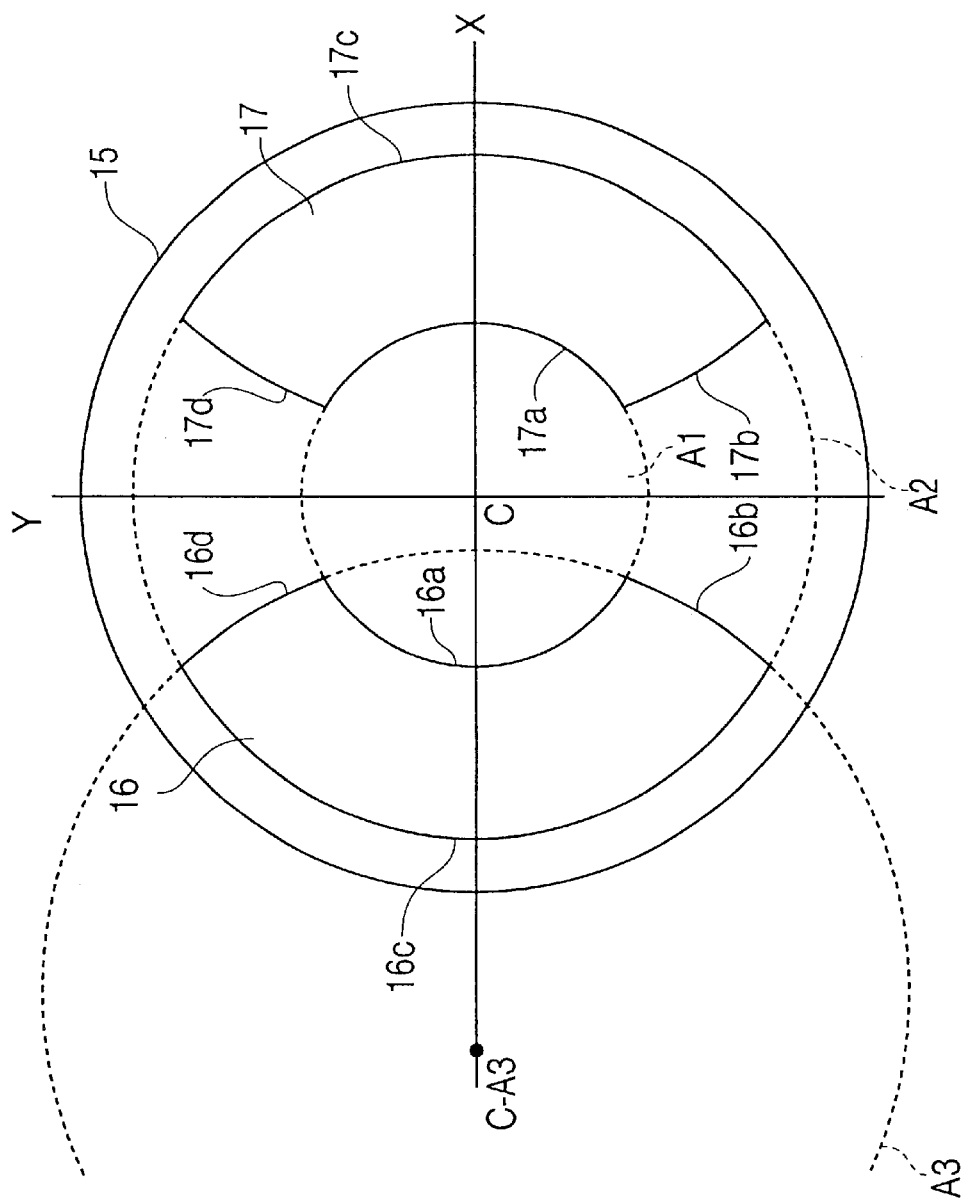
FIG. 4 is a plane view of an aperture according to the second preferred embodiment.

A plane view of an aperture 15 according to a second preferred embodiment is shown in FIG. 4. The aperture 15 includes light transmissive regions 16 and 17. A region outside the light transmissive regions interrupts or blocks the light. An X-axis and a Y-axis pass through the center C of the aperture 15.

A light transmissive region 16 is defined by a first curve 16a, a second curve 16b, a third curve 16c and a fourth curve 16d. In this embodiment, these curves are arcs. The first curve 16a is opposite to the third curve 16c, and the second curve 16b is opposite to the fourth curve 16d. The first curve 16a is salient toward to the third curve 16c and the third curve 16c, is salient away from the first curve 16a. The second curve 16b is salient away from the fourth curve 16d, and the fourth curve 16d is salient away from the second curve 16b. As shown in FIG. 4, the light transmissive region 17 is similarly configured.

The first curves 16a and 17a are located on the circumference of an imaginary circle A1. The center of the circle A1 corresponds to the center C of the aperture 15. The third curves 16c and 17c are located on the circumference of a imaginary circle A2. The circle A1 and the circle A2 are concentric circles. A diameter of the circle A1 is half a diameter of the circle A2.

The second curves 16b and 16d are located on the circumference of an imaginary circle A3. The center C-A3 of the circle A3 is on the X-axis at a distance of 1.3 times a radius of the circle A2 from the center C. A radius of the circle A3 is 1.1 times the radius of the circle A2. The light transmissive region 17 is similarly configured.

The light transmissive regions 16 and 17 are symmetrical about the Y-axis, and symmetrical with respect to the center C.

In the exposure process, in the case where a Y-axis of the reticle 6 is set to coincide with the Y-axis of the aperture 15, the second curve 16b and the fourth curve 16d contribute to an improved resolution and optimum depth of focus (DOF) with respect to patterns which are formed in the direction of the Y-axis on the reticle 6. The first and third curves 16a, 16d contribute to an resolution and DOF with respect to patterns which are formed in all directions on the reticle 6. In particular, the first curve 16a and the third curve 16c contribute to a significant improvement with respect to inclined patterns between the X-axis and the Y-axis, as compared with the second curve 16b and fourth curve 16d. The second light transmissive region 17 functions in a similar manner.

If the size of each light transmissive region is reduced in size, it is possible to further improve resolution and optimum depth of focus. Further, a mechanical strength of the aperture is increased. In FIG. 4, as the angles between adjacent curves are comparatively large, a uniformity of the distribution of light strength is improved in the exposure process.

Above the semiconductor wafer 8, as a result of an offset between the light transmitted through the light transmissive region 16 and the light transmitted through the light transmissive region 17 and an offset between 0-order light and −1-order light, a good resolution can be obtained even in the case where the circuit patterns formed on the reticle 6 are very fine.

If the aperture 15 is rotated 90 degrees such that the Y-axis thereof is coincident with an X-axis of the reticle 6, an improved resolution and optimum depth of focus (DOF) is realized with respect to patterns which are formed in the direction of the X-axis on the reticle 6. If the angle of rotation of the aperture 15 is changed, several patterns which are formed in all directions can be applied.

Similar to the first preferred embodiment, if the size of each light transmissive region is reduced in size, it is possible to further improve resolution and optimum depth of focus. Further, a mechanical strength of the aperture is increased. The diaphragm of each light transmissive region can be selected by a designer in consideration of the width of a fine pattern and a throughput in the exposure process.

Further, a variational aperture in which the first curves and the third curves are not defined by concentric circles, and another variational aperture in which each curve is salient in opposited directions to that shown in FIG. 4, are possible. Further, this preferred embodiment, the curves are defined by the arcs of a circle. However, the curves can be defined by other shapes, such as ellipses.

Figure 5:
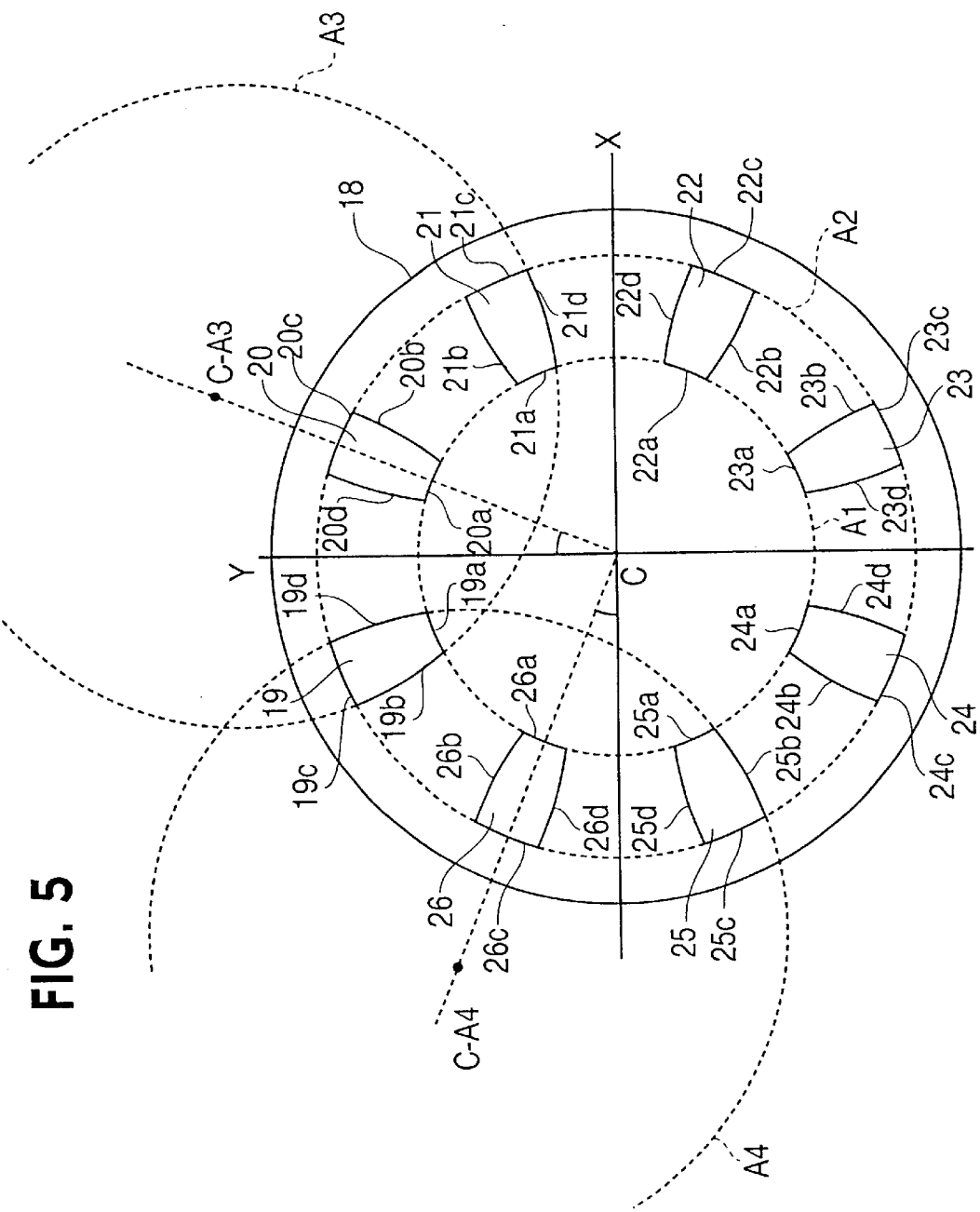
FIG. 5 is a plane view of an aperture according to the third preferred embodiment.

A plane view of an aperture 18 according to a third preferred embodiment is shown in FIG. 5. The aperture 18 includes light transmissive regions 19, 20, 21, 22, 22, 23, 24, 25 and 26. A region outside the light transmissive regions interrupts or blocks the light. An X-axis and a Y-axis pass through the center C of the aperture 18 at right angles.

The light transmissive region 19 is defined by a first curve 19a, a second curve 19b, a third curve 19c and a fourth curve 19d. In this embodiment, these curves are arcs. The first curve 19a is opposite to the third curve 19c and the second curve 19b is opposite to the fourth curve 19d. The first curve 19a is salient toward to the third curve 19c, and the third curve 19c is salient away from the first curve 19a. The second curve 19b is salient away from the fourth curve 19d, and the fourth curve 19d is salient away from the second curve 19b. As shown in FIG. 5, the light transmissive regions 20–26 are similarly configured.

The first curves 19a, 20a, 21a, 22a, 23a, 24a, 25a and 26a are located on the circumference of an imaginary circle A1. The center of the circle A1 corresponds to the center C of the aperture 18. Each of the light transmissive regions are spaced about by 45 degrees.

The third curves 19c, 20c, 21c, 22c, 23c, 24c, 25c and 26c are located on the circumference of an imaginary circle A2. The circle A1 and the circle A2 are concentric circles. A diameter of the circle A1 is seven tenths a diameter of the circle A2.

The second curve 19b is located on the circumference of an imaginary circle A3. The center C-A3 of the circle A3 is on an axis which is rotated clockwise from the Y-axis by 22.5 degrees and is spaced a distance of 1.3 times a radius of the circle A2 from the center C. A radius of the circle A3 is 1.0 times the radius of the circle A2.

The fourth curve 19d is located on the circumference of an imaginary circle A4. The center C-A4 of the circle A4 is on an axis which is rotated clockwise from the X-axis by 22.5 degrees and is spaced at a distance of 1.3 times a radius of the circle A2 from the center C. A radius of the circle A4 is 1.0 times the radius of the circle A2.

The second curve 26b of the light transmissive region 26 is located on the circumference of an imaginary circle A5 (not shown). The center C-A5 (not shown) of the circle A5 is on an axis which is rotated counterclockwise from the X-axis by 22.5 degrees and is spaced at a distance of 1.3 times a radius of the circle A2 from the center C. A radius of the circle A5 is 1.0 times the radius of the circle A2.

The fourth curve 26d of the light transmissive region 26 is located on the circumference of an imaginary circle A6 (not shown). The center C-A6 (not shown) of the circle A6 is on an axis which is rotated counterclockwise from the Y-axis by 22.5 degrees and is spaced at a distance of 1.3 times a radius of the circle A2 from the center C. A radius of the circle A6 is 1.0 times the radius of the circle A2.

A pair of the light transmissive regions 19, 26 are symmetrical about the X-axis and the Y-axis with the pair of light transmissive regions 24, 25 and the pair of light transmissive regions 20,21, respectively. For example, the light transmissive 19 and the light transmissive region 20 are symmetrical about the Y-axis, and the light transmissive 26 and the light transmissive region 21 are symmetrical about the Y-axis. The light transmissive region 20 and the light transmissive region 23 are symmetrical about the X-axis and the light transmissive region 21 and the light transmissive region 22 are symmetrical about the X-axis. The light transmissive region 22 and the light transmissive region 25 are symmetrical about the Y-axis, and the light transmissive region 23 and the light transmissive region 24 are symmetrical about the Y-axis.

Also, the light transmissive region 19 and the light transmissive region 26 are symmetrical about an axis which is rotated counterclockwise from the Y-axis by 45 degrees. In other words, adjacent light transmissive regions are symmetrical about a line extending therebetween. Also, these light transmissive regions are symmetrical with respect to the center C.

In the exposure process, in the case where an X-axis and a Y-axis of the reticle 6 are set to coincide with the X-axis and the Y-axis of the aperture 18, the fourth curve 19d contributes to an improved resolution and optimum depth of focus (DOF) with respect to patterns which are formed in the direction of the Y-axis on the reticle 6. The fourth curve 26d contributes to an improved resolution and DOF with respect to patterns which are formed in the direction of the X-axis on the reticle 6. The second curves 19b and 26b contribute to an improved resolution and DOF with respect to inclined patterns between the X-axis and the Y. The first curves 19a and 26a and the third curves 19c and 26c contribute to an improved resolution and DOF with respect to patterns which are formed in all directions on the reticle 6.

In particular, the first curve 19a contributes to a significant improvement with respect to the inclined patterns between the X-axis and the Y-axis and the patterns which are formed in the direction of the Y-axis on the reticle 6, as compared with the second curve 19b and fourth curve 19d. Also, the first curve 26a contributes to a significant improvement with respect to the inclined patterns between the X-axis and the Y-axis and the patterns which are formed in the direction of the X-axis on the reticle 6, as compared with the second curve 26b and fourth curve 26d.

With respect to the patterns which are formed in the direction of the Y-axis, it is possible to further enhance the resolution by reducing radius of the circle A4 while maintaining the location of the center C-A4, and/or by increasing a distance between the center C of the aperture 18 and the center of the circle.

With respect to the patterns which are formed in the direction of the X-axis, it is possible to further enhance the resolution by reducing the radius of the circle A6 while maintaining the location of the center C-A6, and/or by increasing a distance between the center C of the aperture 18 and the center of the circle A6.

With respect to the inclined patterns between the X-axis or the Y-axis and the axis which is rotated counterclockwise from the Y-axis by 45 degrees, it is possible to further enhance the resolution by reducing radius of the circles A3 and A5 while maintaining the location of the centers C-A3 and C-A5, and/or by increasing a distance between the center C of the aperture 18 and the centers of the circle A3 and A5.

Further, with respect to the inclined patterns between the Y-axis and the hypothetical axis, it is possible to further enhance the resolution by increasing the radius of the circles A1 while maintaining the location of the centers C-A1.

Further, with respect to the inclined patterns between the X-axis and the hypothetical axis, it is possible to further enhance the resolution by increasing the radius of the circles A1 while maintaining the location of the centers C-A1.

The other transmission regions 20 and 21, 22 and 23, 24 and 25 have similar characteristics.

If a size of each light transmissive regions is reduced in size, it is possible to further enhance the resolution and an optimum depth of focus. Further, a mechanical strength of the aperture is increased. In FIG. 5, as angles between adjacent curves are comparatively large, a uniformity of the distribution of light strength is improved in the exposure process.

Above the semiconductor wafer 8, as a result of an offset between the light transmitted through the light transmissive region 19 and the light transmitted through the light transmissive region 23, and an offset between the light transmitted through the light transmissive region 20 and the light transmitted through the light transmissive region 24, and an offset between the light transmitted through the light transmissive region 21 and the light transmitted through the light transmissive region 25, and an offset between the light transmitted through the light transmissive region 22 and the light transmitted through the transmission region 26, and an offset between 0-order light and −1-order light, a good resolution can be obtained even in the case where the circuit patterns formed on the reticle 6 are very fine.

The diaphragm of each of the light transmissive regions can be selected by a designer in consideration of a width of a fine pattern and a throughput in the exposure process.

Further, a variational aperture in which the first curves and the third curves are not defined by concentric circles, and another variational aperture in which each curve is salient in opposited directions to shown in FIG. 5, are possible. The center of the circle A3 can be set on the Y-axis and the center of the circle A4 can be set on the X-axis. The radius of the circle A4 can be changed in consideration of the width of a pattern which is formed in the direction of the Y-axis or a relation of the second curve 19b. In this preferred embodiment, the curves defined by the arcs of a circle. However, the curves can be defined by other shapes, such as ellipses. In this embodiment, the aperture includes eight light transmissive regions. However, this embodiment can be applied to an aperture which has an even number of light transmissive regions, such as sixteen light transmissive regions.

Figure 6:
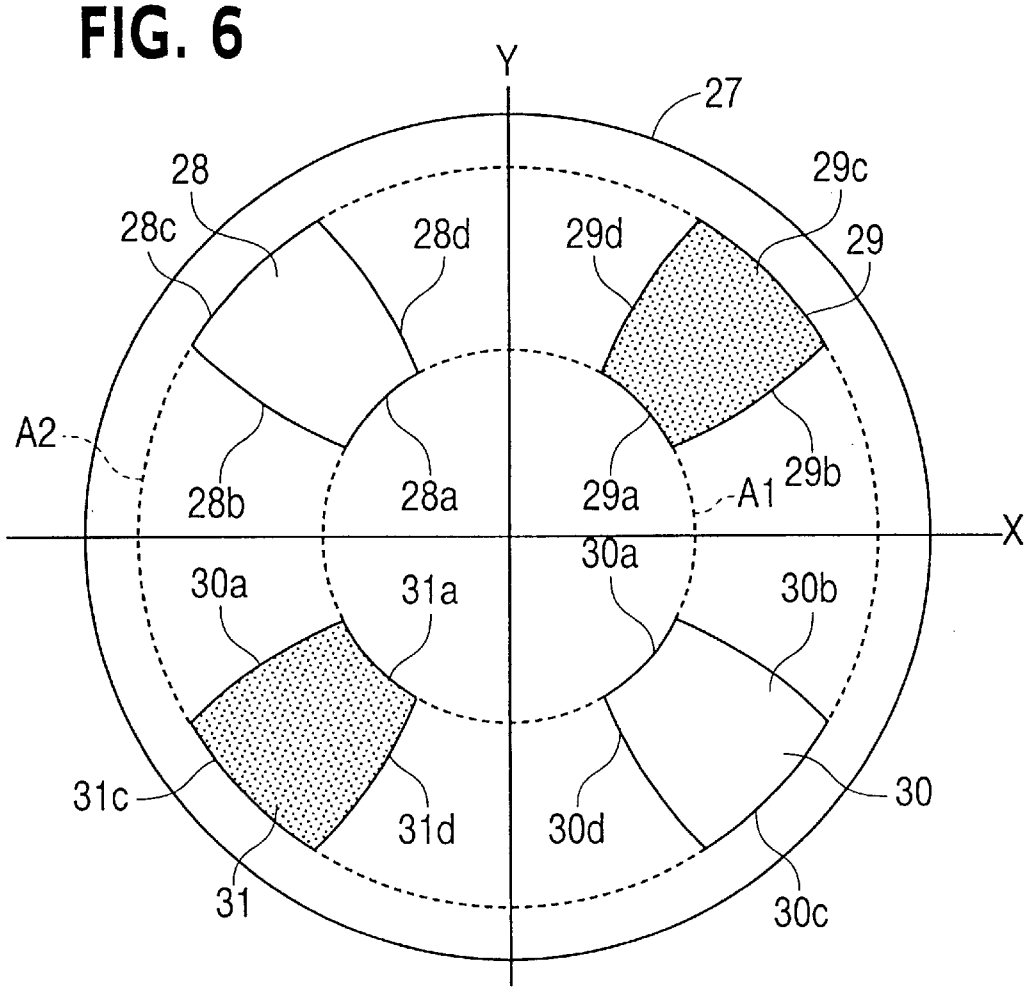
FIG. 6 is a plane view of an aperture according to the fourth preferred embodiment.

A plane view of an aperture 27 according to a fourth preferred embodiment is shown in FIG. 6. The aperture 27 includes light transmissive regions 28, 29, 30 and 31. In this embodiment, the configuration and location of the light transmissive regions are similar to those of the aperture 10 according to the first preferred embodiment. A region outside the light transmissive regions interrupts or blocks the light. A X-axis and a Y-axis pass through the center C of the aperture 27 at right angles.

In this embodiment, phase shifters are arranged in the light transmissive regions 29 and 31. The phase shifters shift the phase of the light transmitted through the light transmissive regions 29 and 31 by 180 degrees.

By using the phase shifters, three types of luminous flux, such as 0-order light, 1-order light and −1-order light can be used above the wafer 8 in the exposure process.

In the exposure process, in the case where a X-axis and a Y-axis of the reticle 6 are set to coincide with the X-axis and the Y-axis of the aperture 27, the 0-order light and the 1-order light are transmitted through the light transmissive regions 28 and 30 and the 0-order light and the −1-order light are transmitted through the light transmissive regions 29 and 31.

So, the 0-order light and the 1-order light are offset above the semiconductor wafer 8. Simultaneously, the 0-order light and the −1-order light are offset. Therefore, as a contrast with respect to the light strength is increased, and a better resolution is obtained.

In FIG. 6, the phase shifters are alternately arranged and can be applied to an aperture which has even number of light transmissive regions, such as the aperture 18 according to the third embodiment or an aperture having sixteen light transmissive regions.

Similar to the first preferred embodiment, if the size of each light transmissive region is reduced, it is possible to further enhance the resolution and an optimum depth of focus. Further, a mechanical strength of the aperture is increased. The diaphragm of each light transmissive region can be selected by a designer in consideration of the width of a fine pattern and a throughput in the exposure process.

Further, a variational aperture in which the first curves and the third curves are not defined by on the concentric circles, and another variational aperture in which each curve is salient in opposited directions to that shown in FIG. 6, are possible. Further, this preferred embodiment, the curves are defined by the arcs of a circle. However, the curves can be defined by other shapes, such as ellipses.

Figure 7:
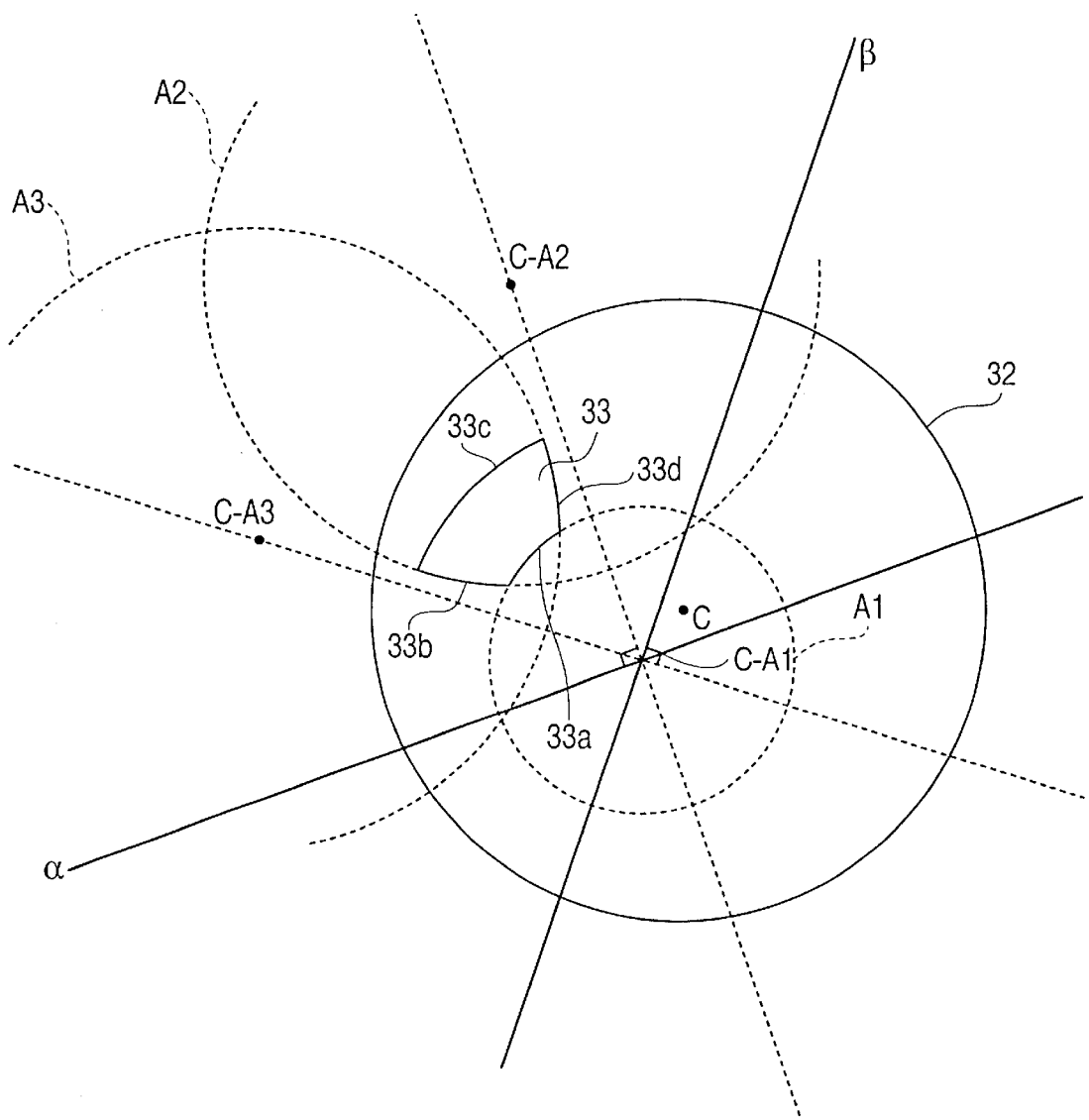
FIG. 7 is a plane view of an aperture according to the fifth preferred embodiment.

A plane view of an aperture 32 according to a fifth preferred embodiment is shown in FIG. 7. The aperture 32 includes a light transmissive region 33. A region outside the light transmissive region interrupts or blocks the light. As shown in FIG. 7, in this embodiment, one light transmissive region is located in the aperture 32.

The light transmissive region 33 is defined by a first curve 33a, a second curve 33b, a third curve 33c and a fourth curve 33d. Also, in this embodiment, these curves are arcs.

The first curve 33a is located on the circumference of an imaginary circle A1. The center of the circle A1 is shown by C-A1. The second curve 33b is located on the circumference of an imaginary circle A2.

A α-axis, and a line which passes through the centers C-A1 and C-A2, pass at right angles through the center C-A1.

The fourth curve 33d is located on the circumference of an imaginary circle A3. The center of the circle A3 is shown by C-A3.

A β-axis, and a line which passes through the centers C-A1 and C-A3, pass at right angles through the center C-A1.

In this embodiment, the center C-A1 is spaced from the center C of the aperture 32. In the exposure process, an optical axis is set to coincide with the center C-A1. However, if the center C of the aperture 32 is set to coincide with the optical axis, the first curve 33a can be adjusted such that the center C-A1 corresponds with the center C.

In the exposure process of the embodiment, the optical axis is set to the center C-A1 and the light transmissive region 33 is set to a predetermined position in response to patterns which are formed on the reticle 6.

During the exposure process, the second curve 33b contributes to an improved resolution and optimum depth of focus (DOF) with respect to patterns which are formed in the direction of the α-axis on the reticle 6. The fourth curve 33d contributes to an improved resolution and DOF with respect to patterns which are formed in the direction of the β-axis on the reticle 6. The second curves 33a and 33c contribute to an improved resolution and DOF with respect to inclined patterns between the α-axis and the β-axis.

Similar to the first preferred embodiment, if the size of the light transmissive region 33 is reduced, it is possible to further improve resolution and optimum depth of focus. As the light transmissive region is comprised of four curves, each curve can be adjusted independently. That is, the light transmissive region can be varied in response to the configuration of the patterns which are formed on the reticle. So, the characteristics of resolution can be adjustable correspondingly with the patterns which are formed in all directions. In FIG. 7, as angles between adjacent curves are comparatively large, a uniformity of the distribution of light strength is improved in the exposure process.

If the size of the light transmissive region is reduced, a mechanical strength of the aperture is increased. The diaphragm of each of the light transmissive regions can be selected by a designer in consideration of the width of a fine pattern and a throughput in the exposure process.

Further, a variational aperture in which the first curve and the third curve are not defined by concentric circles, and another variational aperture in which each curve is salient in opposited directions to that shown in FIG. 7, are possible. Further, In this preferred embodiment, the curves are defined by the arcs of a circle. However, the curves can be defined by other shapes, such as ellipses. Also, a plurality of the light transmissive region can be arranged on the aperture.

Figure 8:
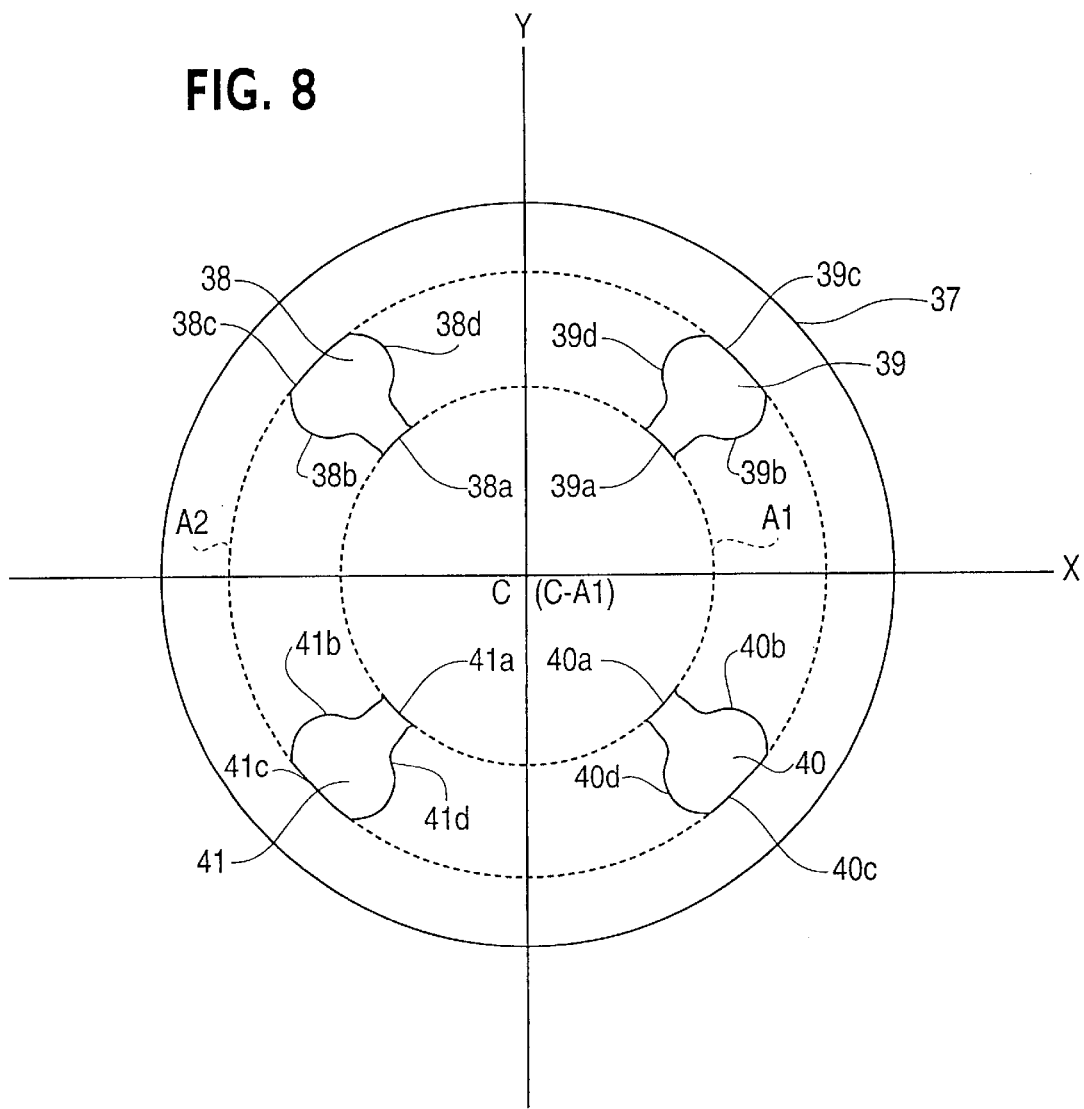
FIG. 8 is a plane view of an aperture according to the sixth preferred embodiment.

A plane view of an aperture 37 according to a sixth preferred embodiment is shown in FIG. 8. The aperture 37 includes light transmissive regions 38, 39, 40 and 41. A region outside the light transmissive regions interrupts or blocks the light.

Each of the light transmissive regions is defined by four curves, such as first curves 38a, 39a, 40a and 41a, second curves 38b, 39b, 40b and 41b, third curves 38c, 39c, 40c and 41c and fourth curves 38d, 39d, 40d and 41d.

However, in this embodiment, the second and fourth curves are comprised of an inside curve and an outside curve, respectively. The inside curve is curved toward to the inside of the transmission region and the outside curve is curved toward to the outside of the transmission region, as shown in FIG. 8. The inside curves are closer to from a center C of the aperture 37 than the outside curves.

An X-axis and a Y-axis pass through the center C of the aperture 37 at right angles.

Also, the first curves 38a, 39a, 40a, 41a are located on the circumference of an imaginary circle Al. The center C-A1 of the circle A1 corresponds to the center C of the aperture 37. The third curves 38c, 39c, 40c, 41c are located on the circumference of an imaginary circle A2.

In the exposure process, in the case where an X-axis and a Y-axis of the reticle 6 are set to coincide with the X-axis and the Y-axis of the aperture 37, the second curves 38b, 39b, 40b and 41b contribute to an improved resolution and optimum depth of focus (DOF) with respect to patterns which are formed in the direction of the X-axis on the reticle 6. The fourth curves 38d, 39d, 40d and 41d contribute to an improvement of a good resolution and DOF according to patterns which are formed in the direction of the Y-axis on the reticle 6. The first and third curves contribute to an improved resolution and DOF with respect to patterns which are formed in all directions on the reticle 6.

In particular, the first curves contribute to a significant improvement with respect to the inclined patterns between the X-axis and the Y-axis on the reticle 6, as compared with the second curves and fourth curves.

As a result of the second and fourth curves, the light transmissive regions are narrow at the side of the center C, and are wider at the side away from the center C. That is, more light is transmitted through the wider portions of the light transmissive regions, as compared with the more narrow portions.

As the aperture 37 can realize a variable light transmission, this aperture 37 can be applied to irregular patterns having a wide width or a narrow width which are formed on the reticle. That is, the aperture of this preferred embodiment is effective for such partial patterns in which a largely or small exposure in necessary. The light transmissive region at the side of the center is effective to the narrow patterns and the light transmissive region at the side away from the center is effective to the wide pattern.

Figure 9:
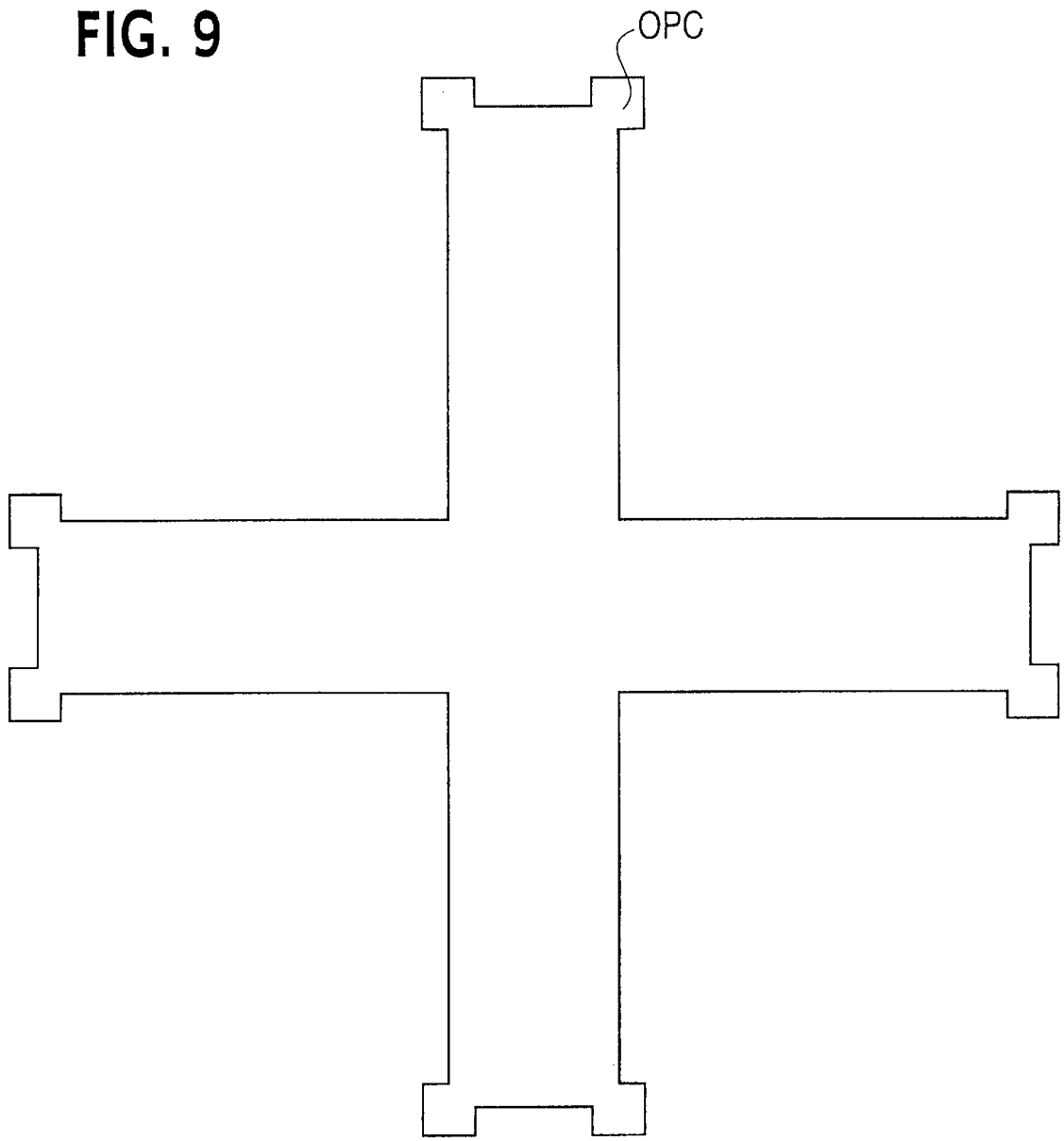
FIG. 9 is a plane view of a pattern having an optical proximity correction.

For example, an irregular pattern in which a large exposure largely is needed at the end of the pattern is shown in FIG. 9. In this pattern, a regular pattern is appended to OPC (Optical Proximity Correction) patterns at the end of the regular pattern.

The OPC pattern is for correcting a transformation which occurs at the transferring pattern from the reticle to the semiconductor wafer. Generally, the OPC pattern is formed at the end of the regular pattern. Whereby the patterns which are formed on the reticle, a dimension is large at the ends of the pattern.

In this irregular pattern, a large exposure amount is necessary at the pattern ends, and a high resolution is necessary for a fine portion, such as a center of the pattern shown in FIG. 9.

Therefore, if the aperture in this embodiment is applied to the pattern shown in FIG. 9, it is possible to provide a large exposure amount at the pattern ends since the light transmissive region is wide in the far side of the center. And since the light transmissive region in the near side of the center is reduced, a high resolution and good DOF can be realized. That is, high quality patterns can be formed on the semiconductor wafer.

The aperture in this embodiment can react to several patterns formed on the reticle. Naturally, for a pattern which has a fine portion at the end and a wide portion at the center, the inside and outside curves of the light transmissive regions are reversed.

If the size of each light transmissive regions is reduced, it is possible to further improve resolution and an optimum depth of focus. Further, a mechanical strength of the aperture is increased. In FIG. 8, as angles between adjacent curves are comparatively large, a uniformity of the distribution of light strength is improved in the exposure process.

The diaphragm of each of the light transmissive regions can be selected by a designer in consideration of a width of a fine pattern and a throughput in the exposure process.

Further, a variational aperture in which the first curves and the third curves are not defined by concentric circles, and another variational aperture in which the first and third curves are salient in opposited directions to that shown in FIG. 8, are possible.

If a pattern has different length between the X-axis and the Y-axis on the reticle, the first and third curves may also be formed so as to have inside curves and outsides curves.

In this embodiment, the aperture includes four light transmissive regions is described. However, this embodiment can be applied to an aperture which has even number of light transmissive regions, such as eight light transmissive regions. Naturally, the embodiment can be applied to the aperture in the fifth embodiment having one light transmissive region.

Further, if additional curves which cause the angles to be large is arranged between the adjacent curves, the angles between the adjacent curves become larger. Therefore, a uniformity of the distribution of light strength is more and more improved. The additional curves can be applied for every preferred embodiments mentioned above. The additional curves are arranged between the adjacent curves.

Figure 10:
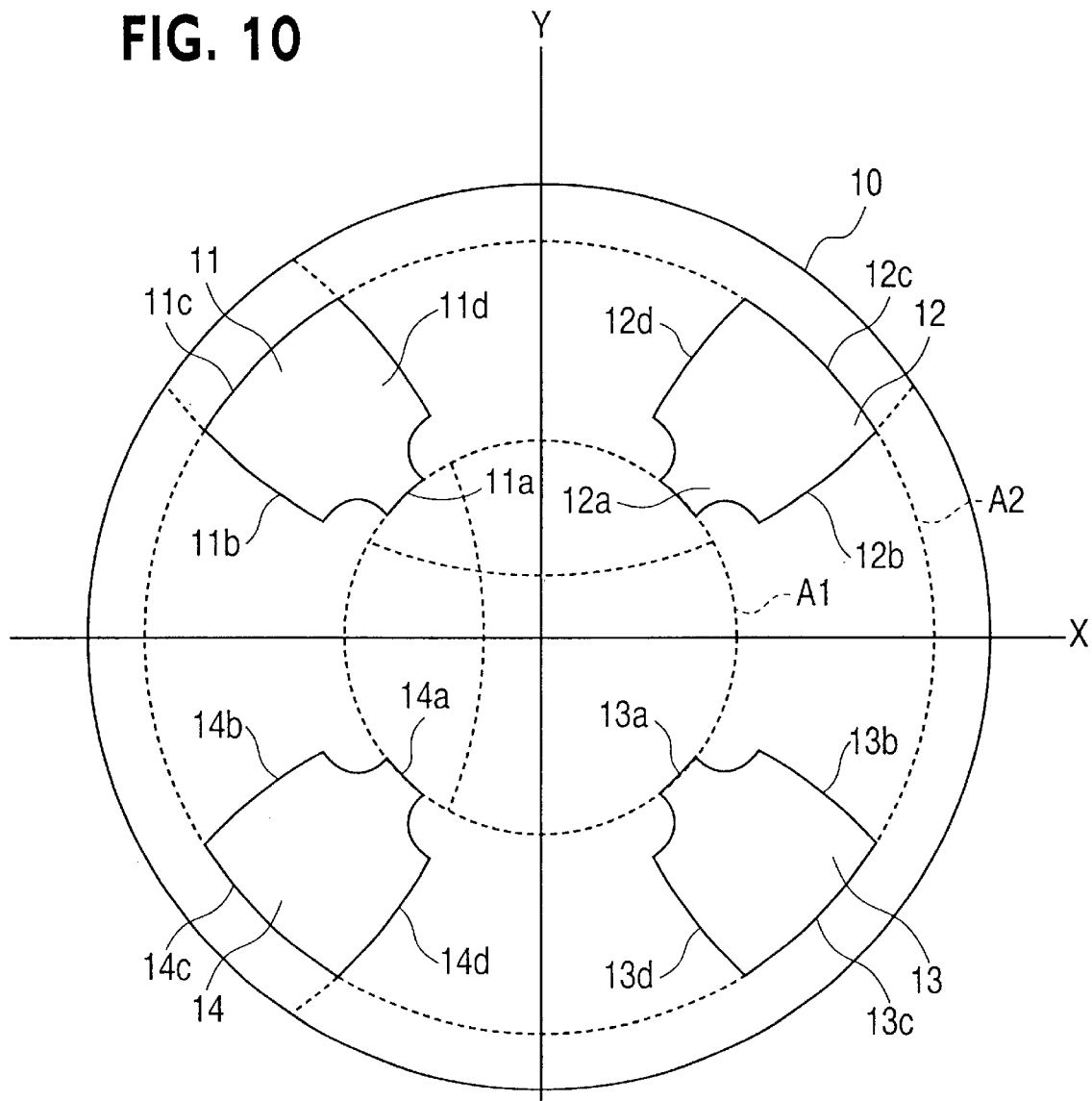
FIG. 10 is additional curves which is applied to the aperture of the first preferred embodiment.

FIG. 10 illustrates the additional curves which are applied to the aperture 10 of the first preferred embodiment. The additional curve 11ab is arranged between the first curve 11a and the second curve 11b and the additional curve 11ad arranged between the first curve 11a and the fourth curve 11d. Similarly, the additional curves 12ab is arranged between the first curve 12a and the second curve 12b and the additional curve 12ad is arranged between the first curve 12a and the fourth curve 12d. Similarly, the additional curves 13ab is arranged between the first curve 13a and the second curve 13b and the additional curve 13ad is arranged between the first curve 13a and the fourth curve 13d. Similarly, the additional curves 14ab is arranged between the first curve 14a and the second curve 14b and the additional curve 14ad is arranged between the first curve 14a and the fourth curve 14d.

Figure 11:
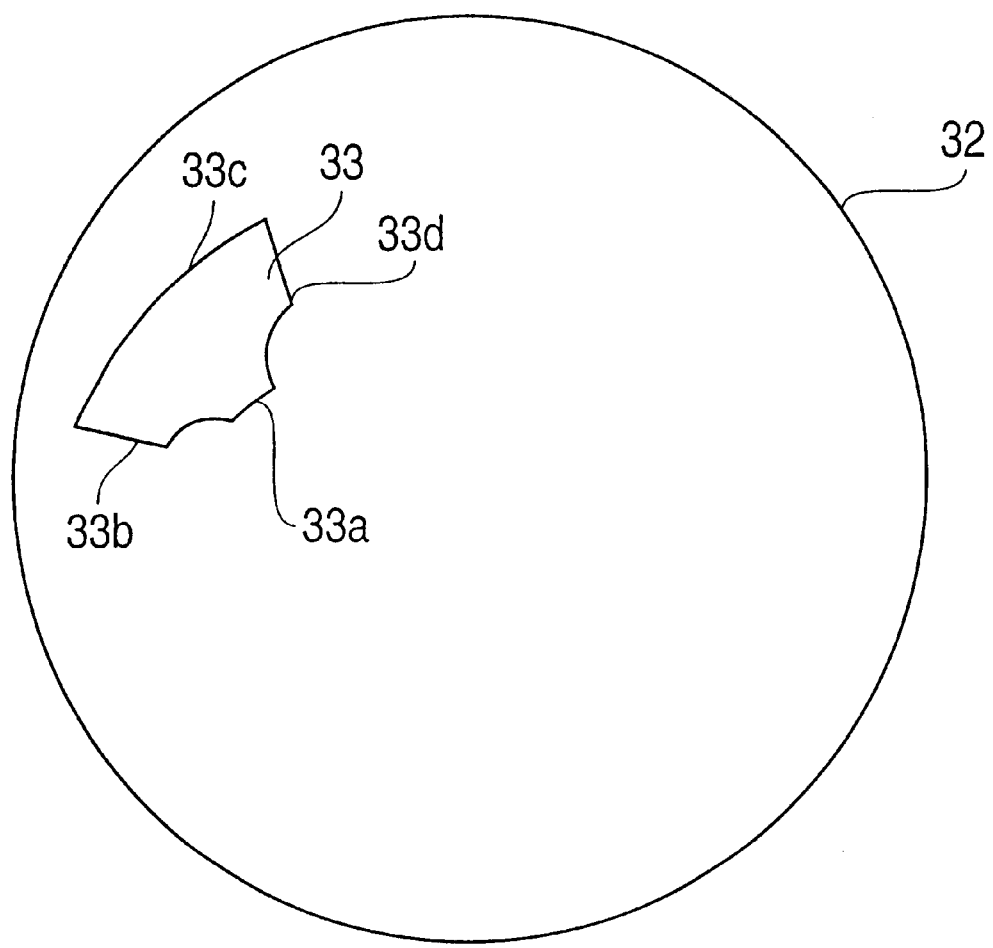
FIG. 11 is additional curves which is applied to the aperture of the fifth preferred embodiment.

Similarly, FIG. 11 illustrates the additional curves which are applied to the aperture 32 of the fifth preferred embodiment. The additional curve 33ab is arranged between the first curve 33a and the second curve 33b and the additional curve 33ad is arranged between the first curve 33a and the fourth curve 33d.

Such additional curve is to make the angle between the adjacent curves larger. Thereby a uniformity of the distribution of light strength is more and more improved. The additional curve can be selected by a designer in consideration of the fine pattern, the throughput and the diaphragm of the aperture.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. An apparatus for an exposure apparatus, said apparatus comprising:
   an aperture body having a plurality of light transmissive regions defined therein, wherein an inner periphery of each light transmissive region includes first, second, third and fourth curved segments; and
   wherein each set of adjacent light transmissive regions are symmetrical about a straight line extending therebetween.

2. The apparatus according to claim 1, wherein each of the first, second, third and fourth curved segments extend in an arc.

3. The apparatus according to claim 2, wherein the first curved segment is opposite to the second curved segment and the third curved segment is opposite to the fourth curved segment, wherein the first curved segment is salient toward to the second curved segment and the second curved segment is salient away from the first curved segment, and wherein the third curved segment is salient away from the fourth curved segment and the fourth curved segment is salient away from the third curved segment.

4. The apparatus according to claim 3, wherein the first curved segments of the plurality of the light transmissive regions are aligned along the circumference of a first circle.

5. The apparatus according to claim 4, wherein the center of first circle is aligned with a center of the aperture body.

6. The apparatus according to claim 5, wherein the second curved segments of the plurality of the light transmissive regions are aligned along the circumference of a second circle, wherein the third curved segments of the plurality of the light transmissive regions are aligned along the circumference of a third circle, wherein the fourth curved segments of the plurality of the light transmissive regions are aligned along the circumference of a fourth circle, wherein a line between the center of the first and second circles and a line between the center of the first and third circles pass through the center of the first circle at right angles, wherein the center of the fourth circle is aligned with the center of the first circle.

7. The apparatus according to claim 1, wherein one curved segment in the first to fourth curved segments is comprised of an inside curved segment and an outside curved segment, wherein the inside curved segment is curved toward to the inside of a corresponding light transmissive region and the outside curved segment is curved toward to the outside of the corresponding light transmissive region.

8. The apparatus according to one of claims 1 to 7, wherein the plurality of the light transmissive regions are comprised of alternately arranged first light transmissive regions and second light transmissive regions, wherein the first light transmissive regions transmit therethrough a light from a light source of the exposure apparatus, and the second light transmissive regions shift a phase of the light transmitted therethrough by 180 degrees.

9. The apparatus according to claim 8, wherein the aperture is adapted for use in an exposure apparatus which forms a fine pattern on a semiconductor wafer.

10. The apparatus according to one of claim 8, further comprising a light source, a light condensing optical lens through which light from said light source is condensed and applied to a reticle carrying a predetermined pattern, and a projection lens which projects the light transmitted through said reticle onto the surface of a semiconductor wafer, wherein the aperture body is interposed between the light source and the light condensing optical lens.

11. The apparatus according to one of claim 1 to 7, wherein the aperture is adapted for use in an exposure apparatus which forms a fine pattern on a semiconductor wafer.

12. The apparatus according to one of claims 1 to 7, further comprising a light source, a light condensing optical lens through which light from said light source is condensed and applied to a reticle carrying a predetermined pattern, and a projection lens which projects the light transmitted through said reticle onto the surface of a semiconductor wafer, wherein the aperture body is interposed between the light source and the light condensing optical lens.

13. The apparatus according to one of claims 1 to 7, further comprising an additional curved segment which is arranged between the first and second curved segments.

14. An apparatus for an exposure apparatus, comprising:
an aperture body having plurality of light transmissive regions defined therein, an inner periphery of each light transmissive region including first, second, third and fourth curved segments; and
wherein opposing pairs of the light transmissive regions are symmetrical with respect to a point interposed therebetween.

15. The apparatus according to claim 14, wherein each of the first, second, third and fourth curved segments extend in an arc.

16. The apparatus according to claim 15, wherein the first curved segment is opposite to the second curved segment and the third curved segment is opposite to the fourth curved segment, wherein the first curved segment is salient toward to the second curved segment and the second curve is salient away from the first curved segment, and wherein the third curved segment is salient away from the fourth curved segment and the fourth curved segment is salient away from the third curved segment.

17. The apparatus according to claim 16, wherein the first curved segment of the plurality of the light transmissive regions are aligned along the circumference of a first circle.

18. The apparatus according to claim 17, wherein the center of the circle is aligned with a center of the aperture body.

19. The apparatus according to claim 18, wherein the second curved segments of the plurality of the light transmissive regions are aligned along the circumference of a second circle, wherein the third curved segments of the plurality of the light transmissive regions are aligned along the circumference of a third circle, wherein the fourth curved segments of the plurality of the light transmissive regions are aligned along the circumference of a fourth circle, wherein a line between the center of the first and second circles and a line between the center of the first and third circles pass through the center of the first circle at right angles, wherein the center of the fourth circle is aligned with the center of the first circle.

20. The apparatus according to claim 14, wherein one curved segment in the first to fourth curved segments is comprised of an inside curved segment and an outside curved segment, wherein the inside curved segment is curved toward to the inside of a corresponding light transmissive region and the outside curved segment is curved toward to the outside of the corresponding light transmissive region.

21. The apparatus according to one of claims 14 to 20, wherein the plurality of the light transmissive regions are comprised of alternately arranged first light transmissive regions and second light transmissive regions, wherein the first light transmissive regions transmit therethrough a light from a light source of the exposure apparatus, and the second light transmissive regions shift a phase of the light transmitted therethrough by 180 degrees.

22. The apparatus according to one of claim 21, wherein the aperture is adapted for use in an exposure apparatus which forms a fine pattern on a semiconductor wafer.

23. The apparatus according to one of claim 21, further comprising a light source, a light condensing optical lens through which light from said light source is condensed and applied to a reticle carrying a predetermined pattern, and a projection lens which projects the light transmitted through said reticle onto the surface of a semiconductor wafer, wherein the aperture body is interposed between the light source and the light condensing optical lens.

24. The apparatus according to one of claims 14 to 20, wherein the aperture is adapted for use in an exposure apparatus which forms a fine pattern on a semiconductor wafer.

25. The apparatus according to one of claims 14 to 20, further comprising a light source, a light condensing optical lens through which light from said light source is condensed and applied to a reticle carrying a predetermined pattern, and a projection lens which projects the light transmitted through said reticle onto the surface of a semiconductor wafer, wherein the aperture body is interposed between the light source and the light condensing optical lens.

26. The apparatus according to one of claims 14 to 20, further comprising an additional curved segment which is arranged between the first and second curved segments.

27. An aperture for an exposure apparatus, comprising:

an aperture body having a light transmissive region defined therein, wherein an inner periphery of the light transmissive region includes first, second, third and fourth curved segments.

28. The aperture according to claim 27, wherein each of the first, second, third and fourth curved segments extend in an arc.

29. The aperture according to claim 28, wherein the first curved segment is opposite to the second curved segment and the third curved segment is opposite to the fourth curved segment, wherein the first curved segment is salient toward to the second curved segment and the second curved segment is salient away from the first curved segment, and wherein the third curved segment is salient away from the fourth curved segment and the fourth curved segment is salient away from the third curved segment.

30. The aperture according to claim 29, wherein the first curved segment of the plurality of the light transmissive regions are aligned along the circumference of a same circle, and wherein the center of the circle is aligned with a center of the aperture body.

31. The aperture according to claim 27, wherein one curved segment in the first to fourth curved segments is comprised of an inside curved segment and an outside curved segment, wherein the inside curved segment is curved toward to the inside of a corresponding light transmissive region and the outside curved segment is curved toward to the outside of the corresponding light transmissive region.

32. The aperture according to one of claim 27 to 31, wherein the aperture is adapted for use in an exposure apparatus which forms a fine pattern on a semiconductor wafer.

33. The apparatus according to one of claims 27 to 31, further comprising an additional curved segment which is arranged between the first and second curved segments.

34. A method for forming a fine pattern on a semiconductor wafer, comprising;

providing a semiconductor wafer;

radiating light from alight source;

condensing the light from the light source using a light condensing optical lens and applying the light to a reticle on which has a predetermined pattern formed thereon;

projecting the light transmitted through the reticle onto the surface of the semiconductor wafer using a projection lens;

interposing an aperture between the light source and the light condensing optical lens, wherein the aperture has a light transmissive region defined therein, wherein an inner periphery of the light transmissive region includes first, second, third and fourth curved segments.

35. The method for forming a fine pattern on a semiconductor wafer according to claim 34, wherein the aperture has a plurality of light transmissive regions defined therein, and wherein adjacent light transmissive regions symmetrical about a straight line passing therebetween.

36. The method for forming a fine pattern on a semiconductor wafer according to claim 34, wherein the aperture has a plurality of light transmissive regions defined therein, and wherein opposing pairs of the light transmissive regions are symmetrical with respect to a point interposed therebetween.

* * * * *